US007076314B2

(12) United States Patent
Saitou

(10) Patent No.: US 7,076,314 B2
(45) Date of Patent: Jul. 11, 2006

(54) PRECISION POSITIONING DEVICE AND PROCESSING MACHINE USING THE SAME

(75) Inventor: Masahiro Saitou, Tokyo (JP)

(73) Assignee: Sumitomo Heavy Industries, Ltd., Tokyo (JP)

(*) Notice: Subject to any disclaimer, the term of this patent is extended or adjusted under 35 U.S.C. 154(b) by 126 days.

(21) Appl. No.: 10/689,696

(22) Filed: Oct. 22, 2003

(65) Prior Publication Data
US 2004/0122536 A1 Jun. 24, 2004

(30) Foreign Application Priority Data
Oct. 24, 2002 (JP) ............... 2002-309589

(51) Int. Cl.
G05B 19/18 (2006.01)
(52) U.S. Cl. ................ 700/56; 318/560; 100/43
(58) Field of Classification Search .............. 700/56, 700/114, 206, 165; 100/177–178, 43; 318/560, 318/566
See application file for complete search history.

(56) References Cited

U.S. PATENT DOCUMENTS

| 3,431,141 | A | | 3/1969 | Eorgan | |
|---|---|---|---|---|---|
| 5,391,002 | A | * | 2/1995 | Eigenbrod | 384/12 |
| 5,424,941 | A | * | 6/1995 | Bolt et al. | 700/28 |
| 5,673,615 | A | * | 10/1997 | Kawakami | 100/35 |
| 5,718,160 | A | * | 2/1998 | Ohsumi | 92/35 |
| 6,467,824 | B1 | * | 10/2002 | Bolotin et al. | 294/64.1 |
| 6,494,039 | B1 | * | 12/2002 | Pratt et al. | 60/368 |
| 6,705,199 | B1 | * | 3/2004 | Liao et al. | 91/363 R |
| 6,799,501 | B1 | * | 10/2004 | Yo et al. | 91/361 |
| 2003/0017350 | A1 | | 1/2003 | Takai et al. | |

FOREIGN PATENT DOCUMENTS

| EP | 1 167 565 | 1/2002 |
|---|---|---|
| EP | 2002/047581 | 2/2002 |
| JP | 56153410 | 11/1981 |
| JP | 63-61006 | 4/1988 |
| JP | 4203602 | 7/1992 |
| JP | 4251306 | 9/1992 |
| JP | 6323302 | 11/1994 |
| JP | 7009295 | 1/1995 |
| JP | 10019008 | 1/1998 |
| JP | 11249746 | 9/1999 |
| JP | 2000-353725 | 12/2000 |
| JP | 2001336504 | 12/2001 |
| JP | 2002-295404 | 10/2002 |
| NL | 7001609 | 8/1971 |

* cited by examiner

OTHER PUBLICATIONS

European Search Report.

Primary Examiner—Leo Picard
Assistant Examiner—Alexander Kosowski
(74) Attorney, Agent, or Firm—Arent Fox PLLC

(57) ABSTRACT

A precision positioning device comprises a hydraulic cylinder extending along the vertical direction and a piston member accommodated in the cylinder. The inside of the cylinder is divided into two chambers by a piston head of the piston member. A hydraulic circuit supplies a fluid at a constant pressure to one of the two chambers and supplies the fluid at a controlled flow rate to the other of the chambers via a servo valve. A control system performs position control with respect to the piston member by controlling the servo valve based on a detection signal from the position sensor, a position command value, a velocity command value, and an acceleration command value. The control system also performs force control with respect to the piston member by controlling the servo valve using detection signals from the first and second pressure sensors and a load command value.

27 Claims, 14 Drawing Sheets

POSITION AND VELOCITY PROFILES DURING S-SHAPED WAVEFORM POSITION CONTROL

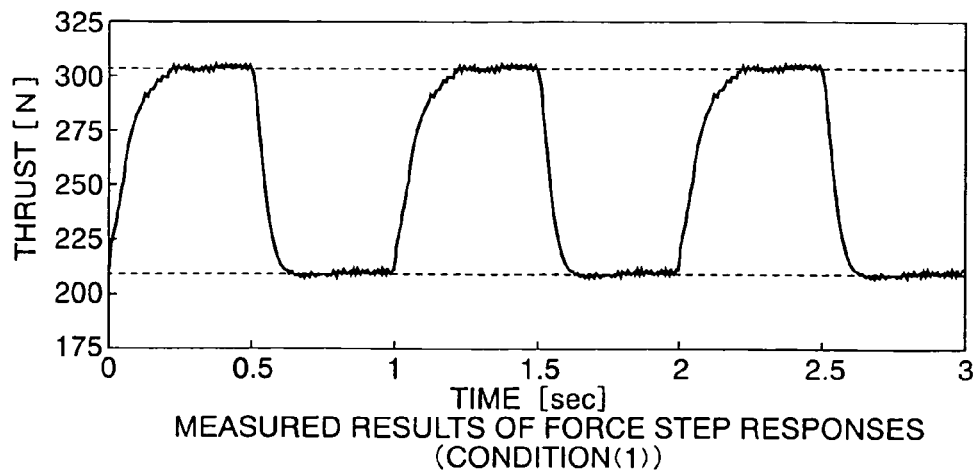

MEASURED RESULTS OF FORCE STEP RESPONSES
(CONDITION(1))

FIG. 13A

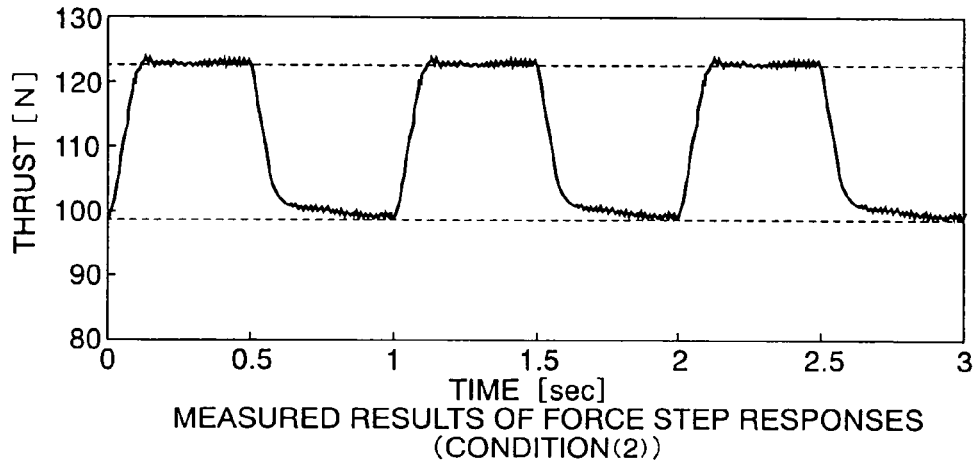

MEASURED RESULTS OF FORCE STEP RESPONSES
(CONDITION(2))

FIG. 13B

THRUST MEAN VALUES AND ERROR WIDTHS IN
FORCE STEP RESPONSE (CONDITION(1))

| THRUST COMMAND VALUE [N] | 300.00 | 200.00 |
|---|---|---|
| THRUST MEAN VALUE [N] | 303.52 | 210.11 |
| ERROR WIDTH [N]* | 0.39 | 0.64 |

*ERROR WIDTH = (MAXIMUM MEASURED VALUE)
               −(MINIMUM MEASURED VALUE)

FIG. 13C

THRUST MEAN VALUES AND ERROR WIDTHS IN
FORCE STEP RESPONSE (CONDITION(2))

| THRUST COMMAND VALUE [N] | 90.00 | 110.00 |
|---|---|---|
| THRUST MEAN VALUE [N] | 99.42 | 122.82 |
| ERROR WIDTH [N]* | 0.06 | 0.27 |

*ERROR WIDTH = (MAXIMUM MEASURED VALUE)
               −(MINIMUM MEASURED VALUE)

FIG. 13D

REPEATED POSITIONING ACCURACY

| PLACE | POSITION MEAN VALUE | 3σ |
|---|---|---|
| x1 | 29.994 [mm] | 0.36 [μm] |
| x2 | 109.975 [mm] | 0.34 [μm] |

PRECISION POSITIONING DEVICE AND PROCESSING MACHINE USING THE SAME

This application claims priority to prior Japanese patent application JP 2002-309589, the disclosure of which is incorporated herein by reference.

BACKGROUND OF THE INVENTION

The present invention relates to a positioning device, and more specifically, it relates to a positioning device capable of precise positioning and force control along the Z-axis (the vertical axis) direction, and a processing machine using the same.

One known application of a positioning device having a positioning function with respect to the vertical direction is a chip mounter. The chip mounter will be described below with reference to FIG. 1.

In FIG. 1, the chip mounter includes a Z-axis feeder 100, and a holder support unit 200 driven along an up-and-down direction by the Z-axis feeder 100. In the Z-axis feeder 100, a servomotor 102 is provided in a device frame 101, and it drives a ball screw mechanism 103 extending along the vertical direction. The ball screw mechanism 103 has a slider 104. The slider 104 is guided by a guide rail 105 provided in the device frame 102.

The holder support unit 200 is a movable section in the ball screw mechanism 103, and is installed in a position opposite to the slider 104 via a holder bracket 201. The holder support unit 200 has an air cylinder 202. In the air cylinder 20, there is provided a tool holder 203 via a hydrostatic bearing 204 so as to be movable along the up-and-down direction. The hydrostatic bearing 204 is for supporting a lower portion of the tool holder 203 in a non-contact state. For this purpose, the hydrostatic bearing 204 receives compressed air supplied from a hole 205 provided in the air cylinder 202, and uniformly disperses the compressed air through a porous member, thereby blowing it onto the outer surface of the tool holder 203.

The up-and-down movement of the tool holder 203 is position-controlled by the differential pressure between the pressure of compressed air supplied from a pressing port 206 opened to the air cylinder 202 and the pressure of compressed air supplied from a balance pressure port 207 opened to the air cylinder 202. At the lower end of the tool holder 203, there is provided a tool 209 for holding a chip 300.

A substrate 401 on which the chip 300 is to be mounted is placed on a substrate holding stage 400. Here, the air cylinder 202 has a position detector 210 for detecting a moving height thereof. The detection signal of the position detector 210 is used for feedback control of the height position.

The above-described chip mounter is disclosed in Japanese Unexamined Patent Publication (JP-A) No. 2000-353725.

In order to allow precise positioning, this chip mounter requires two drive mechanisms: the Z-axis feeder 100 using the ball screw mechanism 103 and the holder support unit 200 using the air cylinder 202.

One possible alternative drive source to the combination of the above-described two drive mechanisms is a linear motor. However, with regard to the chip mounter, its movement is so vigorous that the electromagnet in the linear motor produces heat. This can unfavorably have a detrimental effect on a chip. In addition, when performing positioning control in the Z-axis direction like the chip mounter, it is necessary to perform not only positioning control but also force control (load control) of the movable section. However, in the linear motor, it is difficult to realize force control by current control.

Meanwhile, another patent application assigned to the same assignee as this application proposes the following hydraulic actuator as an alternative drive source to the drive mechanism using the ball screw mechanism or that using the linear motor as described above (see Japanese Unexamined Patent Publication (JP-A) No. 2002-295404).

FIG. 2 is a constructional view of this hydraulic actuator. As shown in FIG. 2, the hydraulic actuator includes a guide shaft 414 and a slider 413 movable therealong. Formed between the guide shaft 414 and the slider 413 is a cylinder chamber. A pressure receiving plate 417 is provided in the slider 413 for dividing the cylinder chamber into two pressure chambers 416A and 416B with respect to the moving direction. By allowing compressed air to enter and exit the two-divided pressure chambers 416A and 416 via servo valves 422A and 422B, respectively, the slider 413 is driven by the differential pressure between the two pressure chambers 416A and 416B.

The hydraulic actuator further includes a position sensor 415 for detecting the position of the slider 413, two servo amplifiers 421A and 421B for controlling the two servo valves 422A and 422B, respectively, and a control computing unit 420 for receiving a position detection signal from the position sensor 415 to output respective position command values to the two servo amplifiers 421A and 412B. Reference numeral 410 denotes a compressed air supply source.

The control computing unit 420 executes the step of calculating a velocity of the slider 413 by differentiating the slider position indicated by the position detection signal, and calculating an acceleration thereof by differentiating the calculated velocity. The control computing unit 420 also executes the step of calculating respective position command values to be outputted to the two servo amplifiers 421A and 421B by using a slider target position, a slider position, a slider velocity, and a slider acceleration. The control computing unit 420 further executes the step of performing computation to compensate for the respective pressure changes of the pressure chambers 16A and 16B due to position changes of the pressure receiving plate 417 in the cylinder chamber, with respect to the respective calculated position command values, and outputting the respective compensated position command values to the two servo amplifiers 421A and 421B, respectively.

In general, a pneumatic actuator using air as a fluid has an advantage that it can provide a high velocity and a high thrust, and that it is low in heating action. However, although the arrangement as described above is suitable for a drive source in the horizontal direction, it is unsuitable for a drive source in the vertical direction, namely, the Z-axis direction. In addition, this type of arrangement requires two expensive servo valves.

SUMMARY OF THE INVENTION

Accordingly, it is an object of the present invention to provide a precision positioning device capable of realizing positioning control and force control with a high accuracy in the Z-axis direction using an air cylinder and a single servo valve as machine elements of a drive source.

It is another object of the present invention to provide a processing machine using the above-described precision positioning device.

The precision positioning device according to the present invention achieves an improvement in the positioning control accuracy and the force control accuracy through the use of a simple mechanism, by including a pneumatic cylinder incorporating a non-contact piston member with hydrostatic bearings, a pneumatic servo valve, and a precision control unit capable of controlling these, as a drive mechanism performing positioning control and force control.

According to the present invention, there is provided a precision positioning device including a hydraulic cylinder fixed so as to extend along the vertical direction; a piston member slidably accommodated in the hydraulic cylinder in a non-contact state via bearings, and including a piston head and a rod extending from the piston head along the central axis direction. The inside of the hydraulic cylinder is divided into two pressure chambers by the piston head. The precision positioning device also includes a hydraulic circuit for supplying a fluid at a constant pressure to one of the two pressure chambers and supplying the fluid at a controlled flow rate to the other of the pressure chambers via a servo valve; first and second pressure sensors for detecting pressures of the one and the other of the pressure chambers, respectively; a position sensor for detecting the position of the piston member; and a control system. The control system performs position control with respect to the piston member by controlling the servo valve based on a position detection signal from the position sensor, a position command value, a velocity command value, and an acceleration command value. The control system also performs force control with respect to the piston member by controlling the servo valve using pressure detection signals from each of the first and second pressure sensors and a load command value.

BRIEF DESCRIPTION OF THE DRAWINGS

FIGS. 13A to 13D are representations of measured results of force step responses and those of thrust mean values and error widths during force control in the precision positioning device according to the present invention;

DESCRIPTION OF THE PREFERRED EMBODIMENTS

Figure 2:
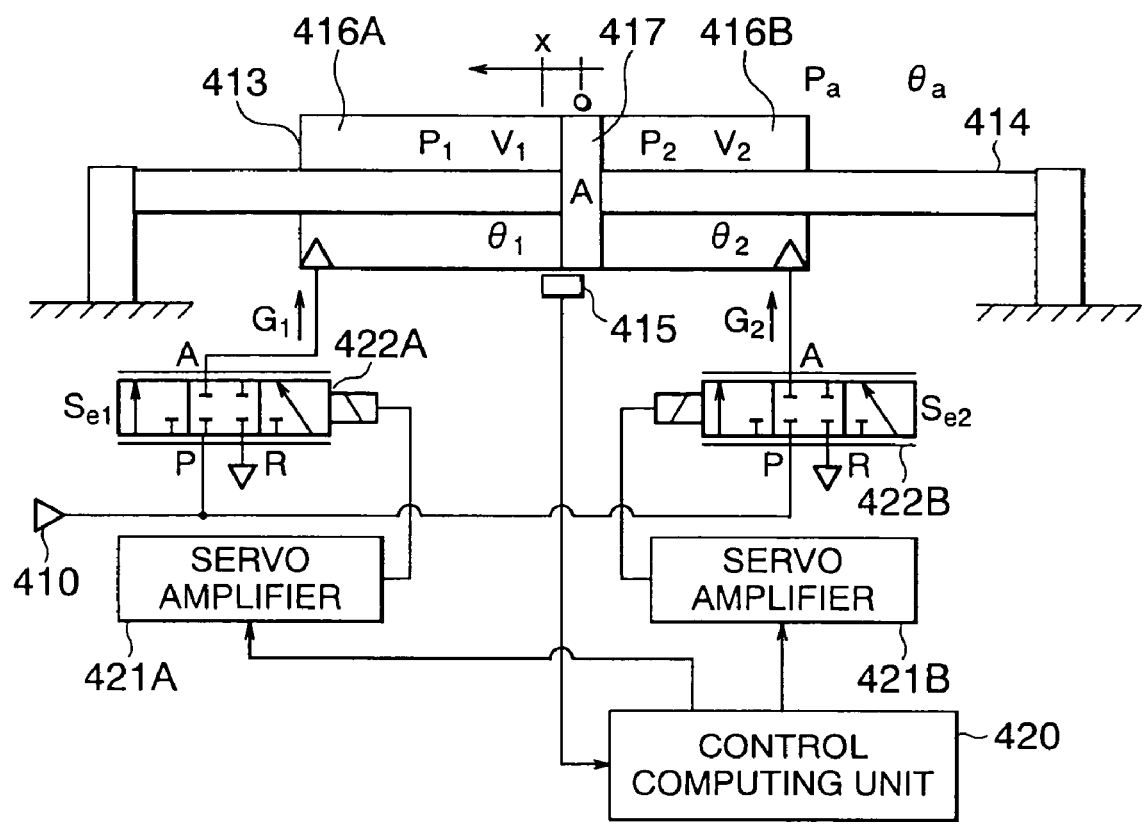
FIG. 2 is a constructional view of a pneumatic actuator proposed by another patent application assigned to the same assignee as this application.
Figure 3:
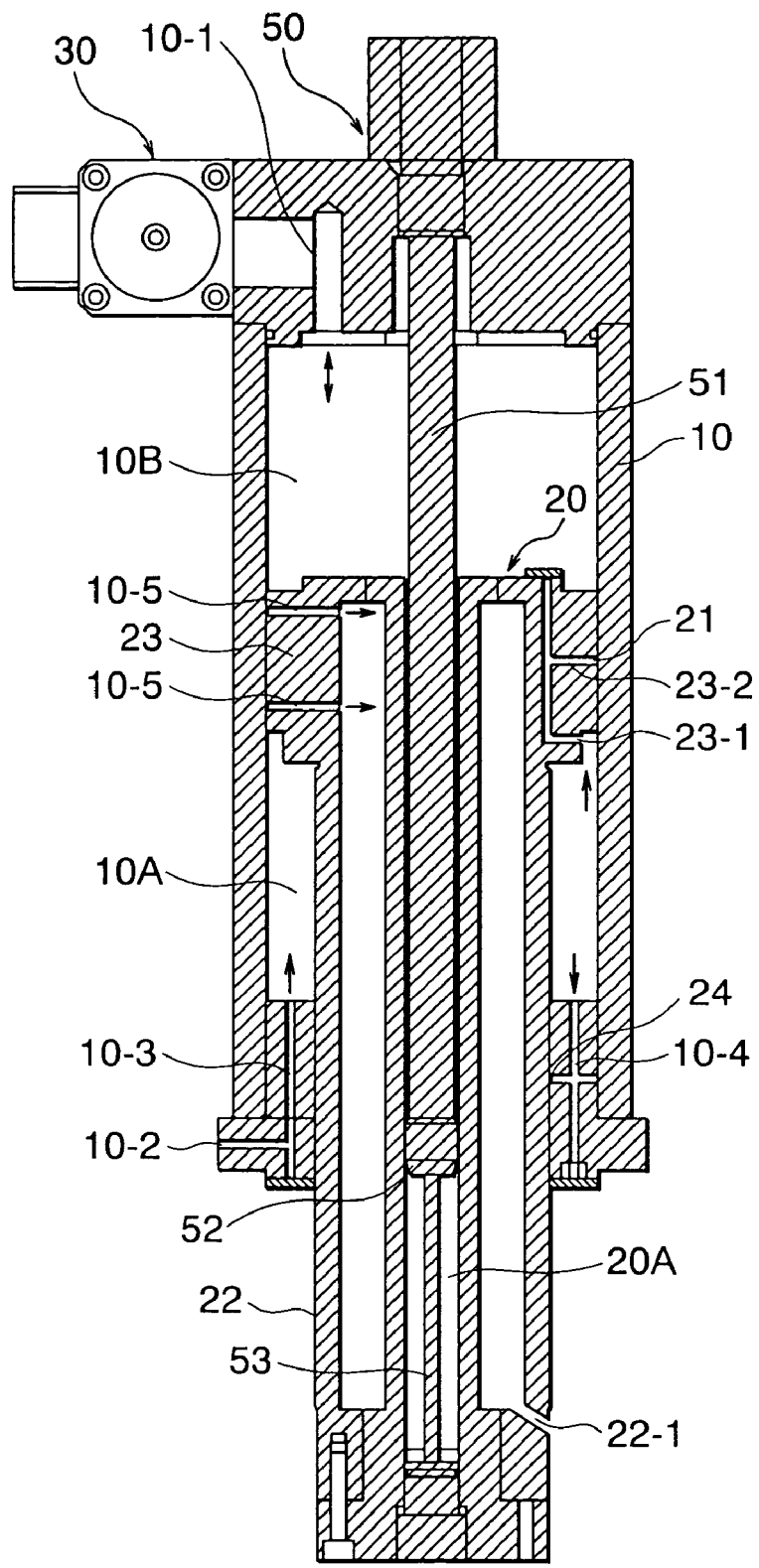
FIG. 3 is a longitudinal sectional view of a precision positioning device according to an embodiment of the present invention.

Hereinafter, an embodiment of a precision positioning device according to the present invention will be described with reference to FIGS. 3 and 4. In FIG. 3, the precision positioning device makes use of the principle of the hydraulic actuator illustrated in FIG. 2. The precision positioning device includes a pneumatic cylinder 10 fixed so as to extend along the vertical direction, namely, the Z-axis direction; a piston member 20 slidably accommodated in the pneumatic cylinder 10 in a non-contact state via a plurality of hydrostatic bearings 21 (first bearings), and including a piston head and a rod 22 extending downward, and a pneumatic circuit 40 (see FIG. 4). The piston member 20 has a piston head 23, and the inside of the pneumatic cylinder 10 is divided into two pressure chambers by the piston head 23. The pneumatic circuit 40 supplies compressed air at a constant pressure to one of the pressure chambers in the pneumatic cylinder 10, which is the lower-side pressure chamber 10A in FIG. 4. The pneumatic circuit 40 also performs pressure control by supplying compressed air at a controlled flow rate to and exhausting it from the other of the pressure chambers, which is the upper-side pressure chamber in FIG. 4, via a servo valve 30. Alternatively, the arrangement may be such that the upper side pressure chamber is kept at a constant pressure and that the servo valve 30 is connected to the lower-side pressure chamber.

Figure 4:
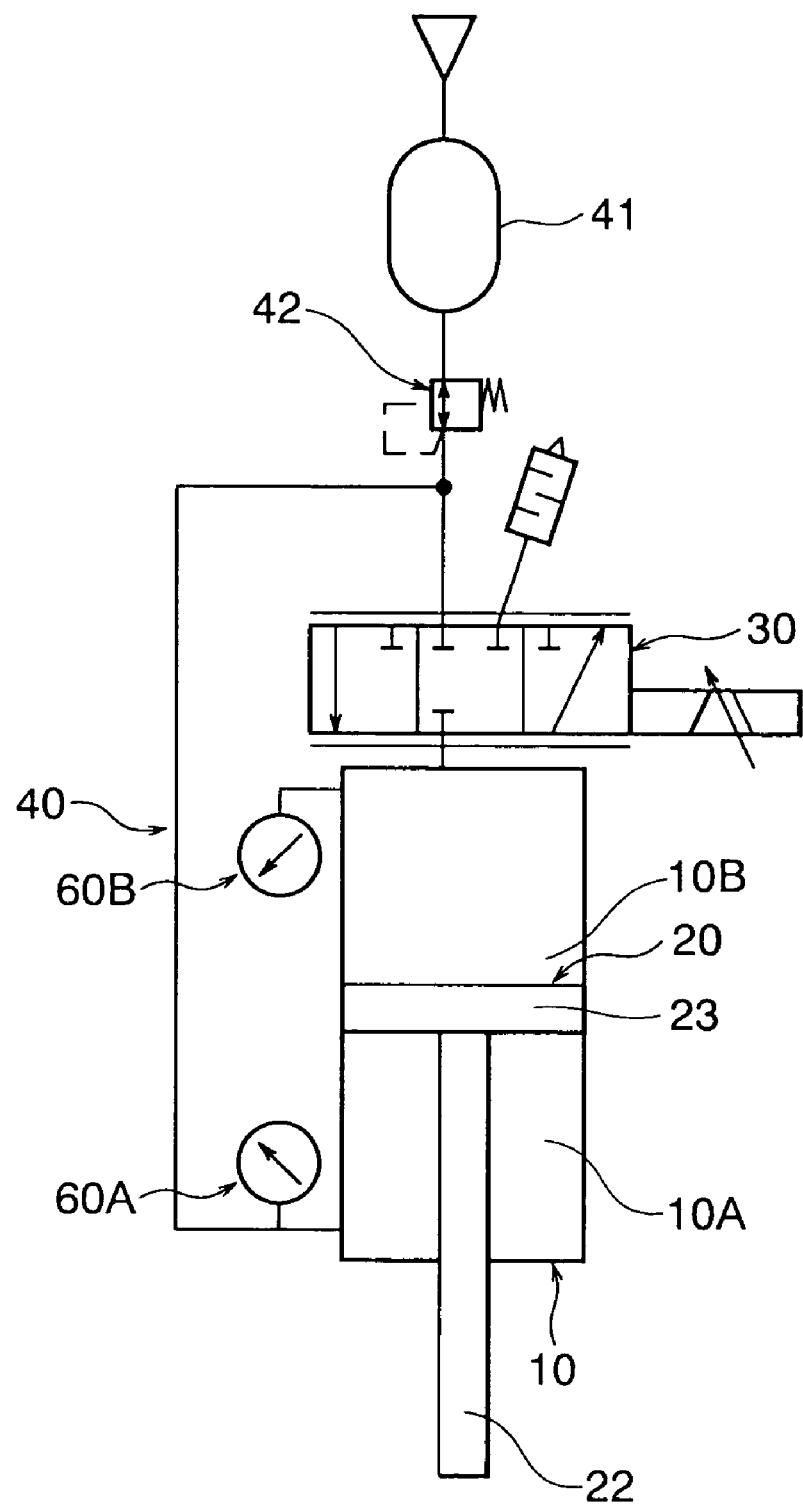
FIG. 4 is a schematic constructional view of the pneumatic circuit in the precision positioning device according to the present invention.

In FIG. 4, the pneumatic circuit 40 secures compressed air at a constant pressure by passing compressed air from a compressed air tank 41 through a regulator 42. As is well known in the art, the servo valve 30 has a spool (not shown). The servo valve 30 has a spool position sensor 31 (not shown in FIG. 4; see FIG. 5) for detecting the position of the spool.

As elements necessary for the position control and the force control with respect to the piston member 20, the precision positioning device also includes a position sensor 50 (see FIG. 3) for detecting the position of a piston member 20, and first and second pressure sensors 60A and 60B for detecting pressures of the pressure chambers 10A and 10B, respectively.

The precision positioning device further includes the following control system. The control system performs position control with respect to the piston member 20 by controlling the servo valve 30 based on a position detection signal from the position sensor 50, a position command value, a velocity command value, and an acceleration command value. The control system also performs force control with respect to the piston member 20 by controlling the servo valve 30 using pressure detection signals from each of the first and second pressure sensors 60A and 60B and a load command value. The force control may also be referred to as "load control". This control system will be discussed later in more detail.

Referring back to FIG. 3, in this embodiment, the servo valve 30 is provided on an upper portion of the side surface of the pneumatic cylinder 10, and compressed air at a controlled pressure is introduced into the pressure chamber 10B through a passage 10-1 provided in the head section of the pneumatic cylinder 10. The pneumatic cylinder 10 has a cylindrical shape. Here, the hydrostatic bearings 21 are provided in a plurality of positions spaced apart from each other along the peripheral direction of the piston head 23 with a circular cross-sectional shape. On the other hand, if the pneumatic cylinder 10 has a quadrangular sectional shape, the hydrostatic bearings 21 are provided on four peripheral surfaces of the piston head 23 with a quadrangular cross-sectional shape, namely, in four positions. As the pneumatic pressure source of each of the hydrostatic bearings, compressed air in the pressure chamber 10B is utilized. For this purpose, the piston head 23 has passages 23-1 for introducing compressed air and passages 23-2 for blowing compressed air onto the inner surface of the pneumatic cylinder 10 (only one passage is shown in FIG. 3 for each of the cases of the passages 23-1 and 23-2). The passages 23-1 and 23-2 may be collectively referred to as "first passages".

In this embodiment, the rod 22 has a double cylindrical shape. The rod 22 is also slidably supported on a lower portion of the pneumatic cylinder 10 in a non-contact state via a plurality of hydrostatic bearings 24 (second hydrostatic bearings). In a lower portion of the pneumatic cylinder 10, there is provided a port 10-2 connected to the constant pressure side of the pneumatic circuit 40 illustrated in FIG. 4. A passage 10-3 for introducing compressed air into the pressure chamber 10A communicates with the port 10-2. Also, a passage 10-4 (third passage) for blowing compressed air onto the outer peripheral surface of the rod 22 communicates with the pressure chamber 10A. If the rod 22 has a double quadrangular cylindrical shape, the hydrostatic bearings 24 would be provided in four positions, as in the case of the hydrostatic bearing 21.

The reason why the rod 22 with a double cylindrical shape is adopted is as follows. The hydrostatic bearing 21 employs compressed air in the pressure chamber 10A, which is different from compressed air in the pressure chamber 10B. Therefore, if part of the compressed air in the pressure chamber 10A leaks into the pressure chamber 10B, the position and force control becomes instable. To prevent this inconvenience, in positions adjacent to the hydrostatic bearings 21 for the piston head 23, there is provided a plurality of passages 10-5 (second passages) for introducing leaking compressed air from the hydrostatic bearings 21 into the double cylinder. The leaking compressed air introduced into the double cylinder is exhausted through an exhaust port 22-1 provided in a lower portion of the rod 22.

In this embodiment, the piston member 20 further has a hole 20A formed in the central axis portion thereof and extending from the piston head 23 to a lower portion of the rod 22. A sensor head 52 of the position sensor 50 is provided in the piston member 20 through the use of a fixed shaft 51 that has been inserted into the hole 20A from above the pneumatic cylinder 10. Here, a magnetic sensor is used as the position sensor 50. To be brief, in a lower portion of the rod 22, there is provided a shaft 53 to be detected that is extended upward and that is inserted in the sensor head 52. The shaft 53 to be detected has grooves formed at minute constant pitches. The shaft 53 to be detected moves together with the piston member 20 with respect to the sensor head 52 in a fixed state. The sensor head 52 counts the number of grooves through which the shaft 53 to be detected has passed during movement, thereby detecting a moving amount thereof, that is, the position thereof with respect to a reference position. When using a magnetic sensor as the position sensor 50, the arrangement may be such that N-poles and S-poles are alternately magnetized on the shaft 53 to be detected at minute constant pitches, and that the magnetic sensor counts the number of poles through which the shaft 53 to be detected has passed during movement.

Figure 5:
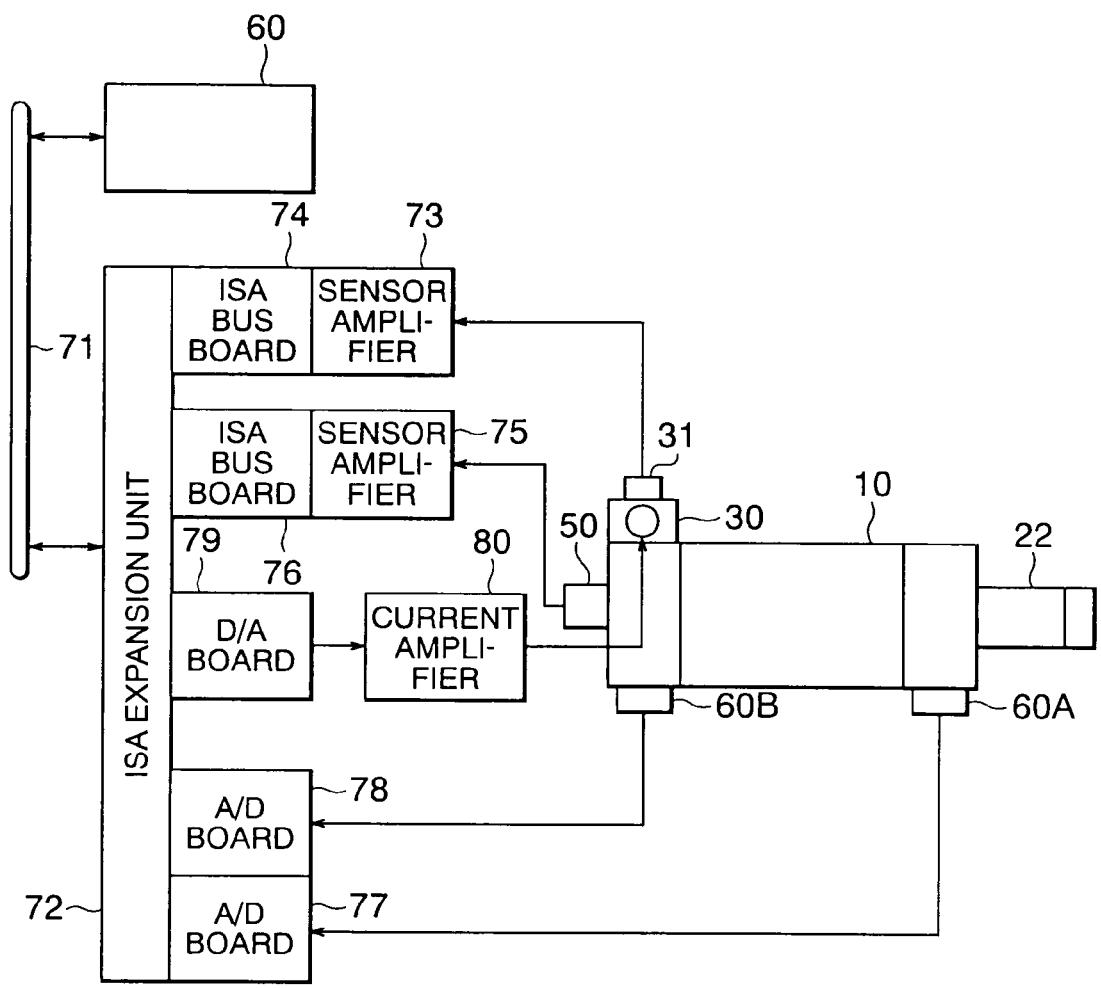
FIG. 5 is a representation of the electrical connection relation between a control computing unit and various sensors in the precision positioning device according to the present invention.

Next, the control system in the precision positioning device will be described with reference to FIG. 5. The control system has a control computing unit 60 implemented by a personal computer or the like. The control computing unit 60 and each sensor are connected through an ISA (Industry Standard Architecture) bus 71 and an ISA expansion unit 72. Specifically, the spool position sensor 31 is connected to the ISA expansion unit 72 through a sensor amplifier 73 and an ISA bus board 74, and the position sensor 50 is connected to the ISA expansion unit 72 through a sensor amplifier 75 and an ISA bus board 76. The fist and second pressure sensors 60A and 60B are connected to the ISA expansion unit 72 through A/D (analog/digital conversion) boards 77 and 78, respectively. With respect to the servo valve 30, a control signal from the control computing unit 60 is outputted through D/A (digital/analog conversion) board 79 and a current amplifier 80. As described later, the control computing unit 60 performs position control with respect to the piston member 20 by capturing a spool position of the servo valve 30 detected by the spool position sensor 31 and a position of the piston member 20 detected by the position sensor 50. The control computing unit 60 also performs thrust control during force control by capturing pressures detected by the first and second pressure sensors 69A and 60B.

Figure 6:
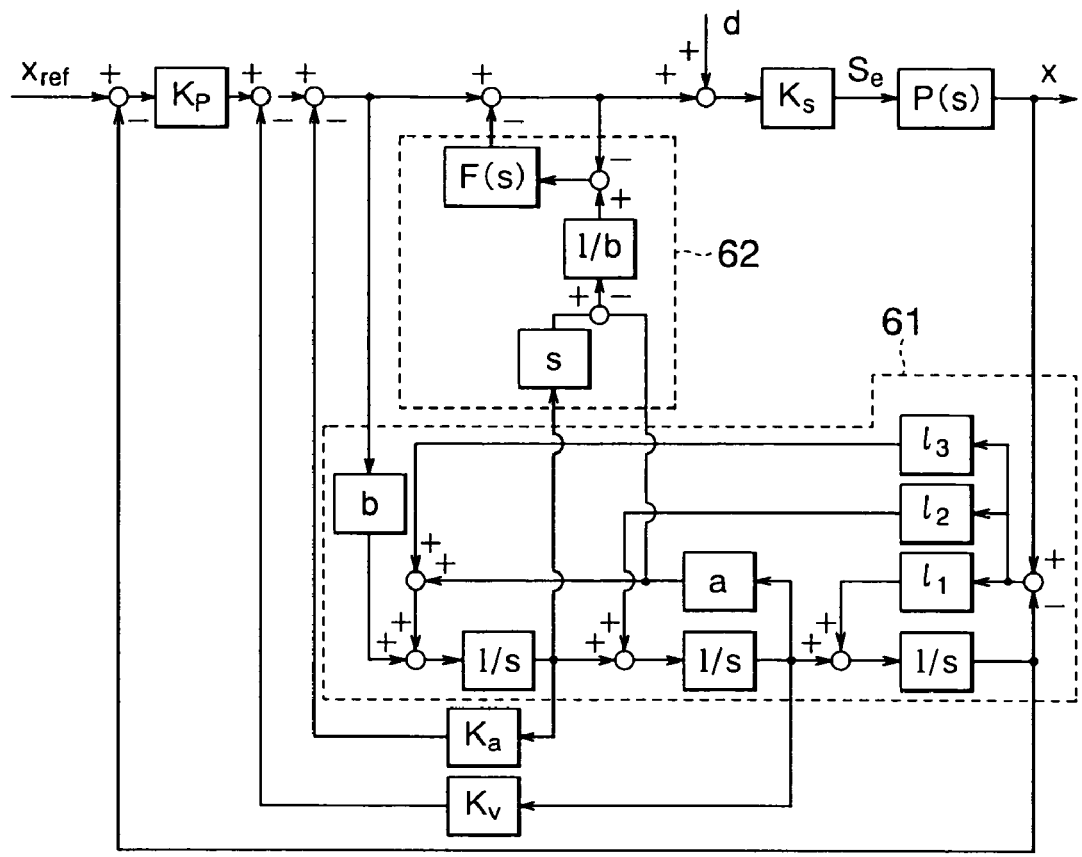
FIG. 6 is a block diagram illustrating the control computation for reducing a steady-state position deviation, the control computation being performed in the control computing unit in the precision positioning device according to the present invention.

FIG. 6 is a block diagram of the control computation performed by the control computing unit 60. The nominal model $P_n$ of the plant (piston system) in FIG. 6 is expressed as follows.

$$P_n(s) = K_n \cdot \omega_n^2 / S(S^2 + \omega_n^2) \quad (1)$$

Here, $K_n$ and $\omega_n$ each denote a constant determined by the characteristic of the plant, and s denotes a differentiator, of which the power denotes the order of a differentiation. The $K_s$ in FIG. 6 denotes a constant determined by the characteristic of the servo valve 30.

Operations of the control computing unit 60 will now be described with reference to FIGS. 3 and 4. Hereinafter, numeral subscripts k=0, 1, . . . denote the sample numbers of sample values obtained by sampling detection signals of the position sensor 50.

Step 1: Air from a compressed air tank 41 is adjusted to an appropriate pressure by the regulator 42 and supplied to the hydrostatic bearings 21. The compressed air from the hydrostatic bearings 21 causes the piston member 20 to be movable without making contact with the pneumatic cylinder 10.

Step 2: The position of the piston member 20 is detected by the position sensor 50, and the position information thereof is outputted by an electrical signal. The detection signal obtained by the position sensor 50 is inputted into the control computing unit 60.

Step 3: The control computing unit 60 samples the detection signals from the position sensor 50, and performs the following computation. From a command value u(k−1) and the position x(k−1) of the piston member 20 detected in the step 2, a computation by a Kalman filter 61 is performed, and an estimated position $x_{ep}(k)$, an estimated velocity $x_{ev}(k)$, and an estimated acceleration $x_{ea}(k)$ of the piston member 20 are obtained using the following expressions. Here, k denotes a current sample value, and (k−1) denotes a sample value one sampling period before. A value with an "e" attached as a suffix denotes an estimated value.

$$x_{ep}(k)=\Delta S[x_{ev}(k-1)+l_1\{x(k-1)-x_{ep}(k-1)\}]+x_{ep}(k-1)$$

$$x_{ev}(k)=\Delta S[x_{ea}(k-1)+l_2\{x(k-1)-x_{ep}(k-1)\}]+x_{ev}(k-1)$$

$$x_{ea}(k)=\Delta S[ax_{ev}(k-1)+b\cdot u(k-1)+l_3\{x(k-1)-x_{ep}(k-1)\}]+x_{ea}(k-1)$$

Here, $a=-\omega_n^2$, $b=K_s K_n \omega_n^2$, and $\Delta S$=a sampling period.

Step 4: From a target position $x_{ref}(k)$ of the piston member 20, and from a feedback value of each of the calculated position estimated value $x_{ep}(k)$, the calculated velocity estimated value $x_{ev}(k)$, and the calculated acceleration estimated value $x_{ea}(k)$ of the piston member 20, a command value u(k) is calculated based on the following expression.

$$u(k)=K_p\{x_{ref}(k)-x_{ep}(k)\}-K_v x_{ev}(k)-K_a x_{ea}(k)$$

Here, $K_p$ denotes a proportional gain, $K_v$ denotes a velocity gain, and $K_a$ denotes an acceleration gain.

Step 5: From a command value u(k−1), a slider estimated velocity $x_{ev}(k-1)$, and an estimated acceleration $x_{ea}(k-1)$, each of which is a value one sampling period before; and from the calculated current estimated acceleration $x_{ea}(k)$, the correction value $d_e(k)$ of the machine difference in the neutral point of the servo valve 30 are calculated using the following expression.

$$d_e(k)=u_e'(k)-u'(k)$$

Here, $u_e'(k)$ and u'(k) are given by the following mathematical expressions (2) and (3), respectively.

$$u_e'(k) = \frac{1}{T_f b}\{x_{ea}(k) - x_{ea}(k-1) - a\Delta T x_{ev}(k-1)\} - \frac{(\Delta T - T_f)}{T_f}u_e'(k-1) \quad (2)$$

$$u'(k) = \frac{1}{T_f}[\Delta T\{u(k-1) - d_e(k-1)\} - (\Delta T - T_f)u'(k-1)] \quad (3)$$

Here, $T_f$ is a filter time constant defined by a disturbance observer 62 shown in FIG. 6, and is given by the following expression.

$$F(s)=1/(T_f s+1)$$

Step 6: From the command value u(k) calculated in the step 4 and $d_e(k)$ calculated in the step 5, a command value to the current amplifier 80 (FIG. 5), i.e., [u(k)−$d^e(k)$] is calculated, and this value is outputted to the current amplifier 80, as an electrical signal.

Step 7: In accordance with a command value [u(k)−$d_e(k)$], the current amplifier 80 controls the spool position of the servo valve 30. The servo valve 30 is supplied with compressed air adjusted to an appropriate pressure by the regulator 42, and the amount of compressed air passing through the servo valve 30 varies depending on the spool position in the servo valve 30.

Step 8: The compressed air past through the servo valve 30 is supplied to the pressure chamber 10B. The differential pressure between the pressure chambers 10A and 10B acts on the piston head 23 to move the piston member 20.

Step 9: The procedure from the step 2 to the step 8 is repeated, and control is performed such that the piston member 20 becomes positioned in the target position $x_{ref}$.

Here, the initial value of each of u(0), $x_{ep}(0)$, $x_{ev}(0)$, $x_{ea}(0)$, and $d_e(0)$ is assumed to be zero.

As described above, in order to estimate the position, velocity, and acceleration of the piston member 20, the Kalman filter 61 is used in this embodiment. In the pneumatic position control system employing the servo valve 30, the neutral point error of the servo valve 30 becomes a disturbance, thereby causing a steady-state position deviation. This disturbance is estimated and cancelled by the disturbance observer 62, whereby the steady-state position deviation is compensated for. Also, by using the disturbance observer 62, it is possible to compensate for disturbance or the robustness against parameter fluctuations of the plant in the band of the filter F(s).

In any event, the use of the Kalman filter 61 and the disturbance observer 62 allows the characteristic of a pneumatic servo system in interest to be brought near to that of the nominal model shown in the above expression (1).

According to the control as described above, the stop position accuracy of the piston member 20 is improved by the Kalman filter 61 and the disturbance observer 62. Provided that the piston member 20 is moved in steps and only the stop position accuracy is a matter of concern, such control suffices. However, if the accuracy of the piston member 20 during movement is a matter of concern, the above-described control does not suffice, because a steady-state velocity deviation occurs when the target value continuously varies, like when the piton member 20 moves at a uniform velocity.

Accordingly, a method for reducing a steady-state velocity deviation will be discussed below.

Figure 7:
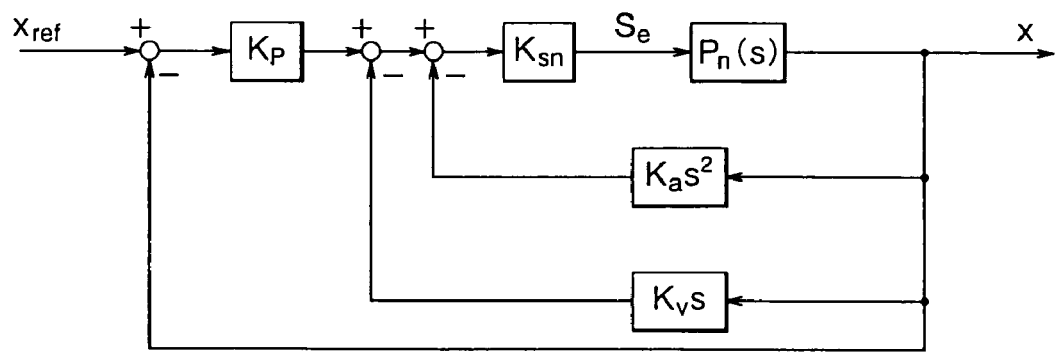
FIG. 7 is a simplified representation of the block diagram shown in FIG. 6.

When a disturbance (a neutral point error in the servo valve) is corrected by the disturbance observer 62, and a position, a velocity, and an acceleration are correctly estimated by the Kalman filter 61, the block diagram in FIG. 6 can be converted into a simple block diagram as shown in FIG. 7. In FIG. 7, the constant $K_s$ (servo valve gain) determined by the actual characteristic of the servo valve 30 is assumed to be equal to a servo valve gain $K_{sn}$ that is estimated in the control computing unit 60, and the characteristic P(s) of the plant (piston system) is also assumed to be equal to the nominal model $P_n(s)$.

In this case, the closed-loop transfer function from the target value $x_{ref}$ to a control amount x is given by $$G_c(S) = x/x_{ref}$$
$$= A_3/(s^3 + A_1 s^2 + A_2 s + A_3)$$

Figure 8:
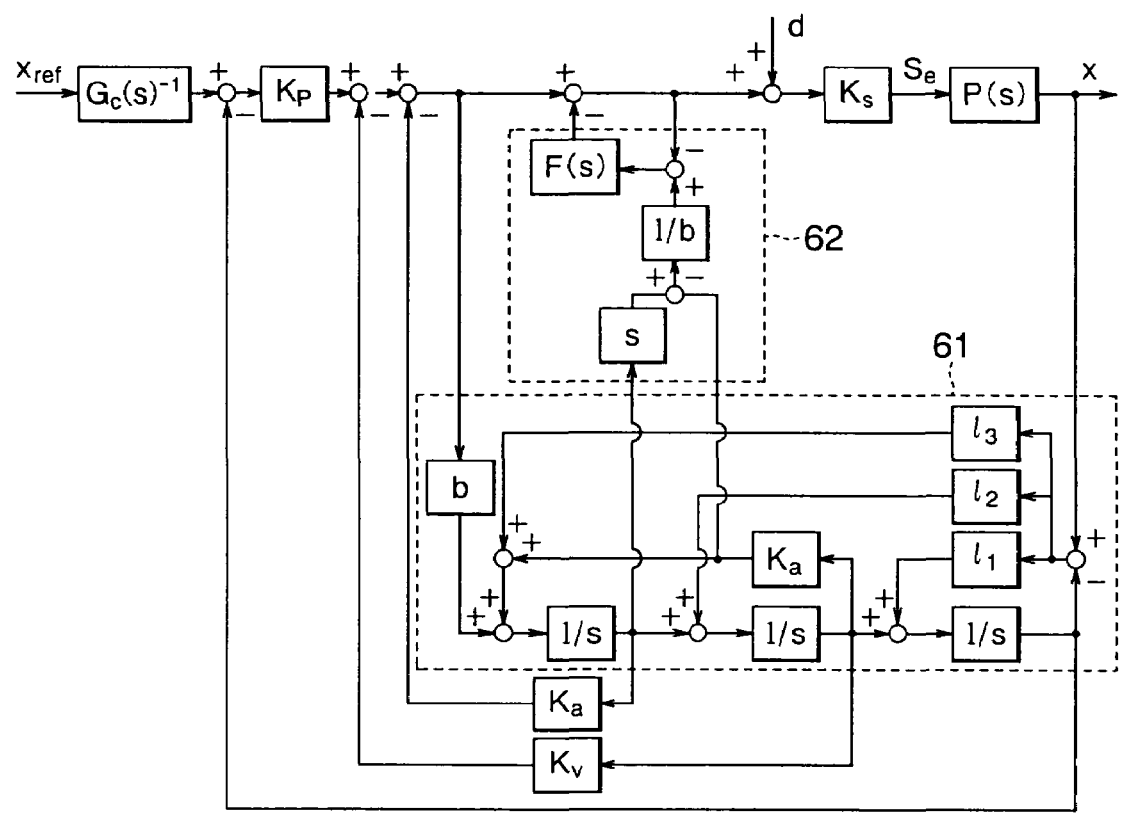
FIG. 8 is another block diagram illustrating control computation for reducing a steady-state position deviation, the control computation being performed in the control computing unit in the precision positioning device according to the present invention.

Here, $A_1 = K_{sn} K_n \omega_n^2 K_a$ $A_2 = (1 + K_{sn} K_n K_v)\omega_n^2$ $A_3 = K_{sn} K_n \omega_n^2 K_p$ As shown in FIG. 8, in order to reduce the steady-state velocity deviation, it is advisable that the inverse model $G_c(s)^{-1}$ with respect to the above-described closed-loop transfer function is inserted into the input section of the target value $x_{ref}$ in the block diagram in FIG. 6. The insertion of such an inverse model renders the overall transfer function to 1, which is an ideal value, thereby reducing the stead-state velocity deviation.

The target value $x_{ref}$ multiplied by the inverse model $G^c(s)^{-1}$ can be calculated using the following expression.

$$x_{ref} G_c(s)^{-1} = x_{ref}(s^3 + A_1 s^2 + A_2 s + A_3)/A_3$$
$$= (j_{ref} + A_1 a_{ref} + A_2 v_{ref} + A_3 x_{ref})/A_3$$

Here, $v_{ref}$ is a target velocity obtained by the first-order differentiation of the target value $x_{ref}$, and $a_{ref}$ is a target acceleration obtained by the second-order differentiation of the target value $x_{ref}$, and $j_{ref}$ is a target jerk obtained by the third-order differentiation of the target value $x_{ref}$.

Therefore, the discrete command value $u(k)$ is calculated by the following mathematical expression (4).

$$u(k) = K_p \left\{ \frac{j_{ref}(k) + A_1 a_{ref}(k) + A_2 v_{ref}(k) i A_3 x_{ref}(k)}{A_3} - x_{ep}(k) \right\} - \quad (4)$$
$$K_v x_{ev}(k) - K_a x_{ea}(k)$$

Figure 9:
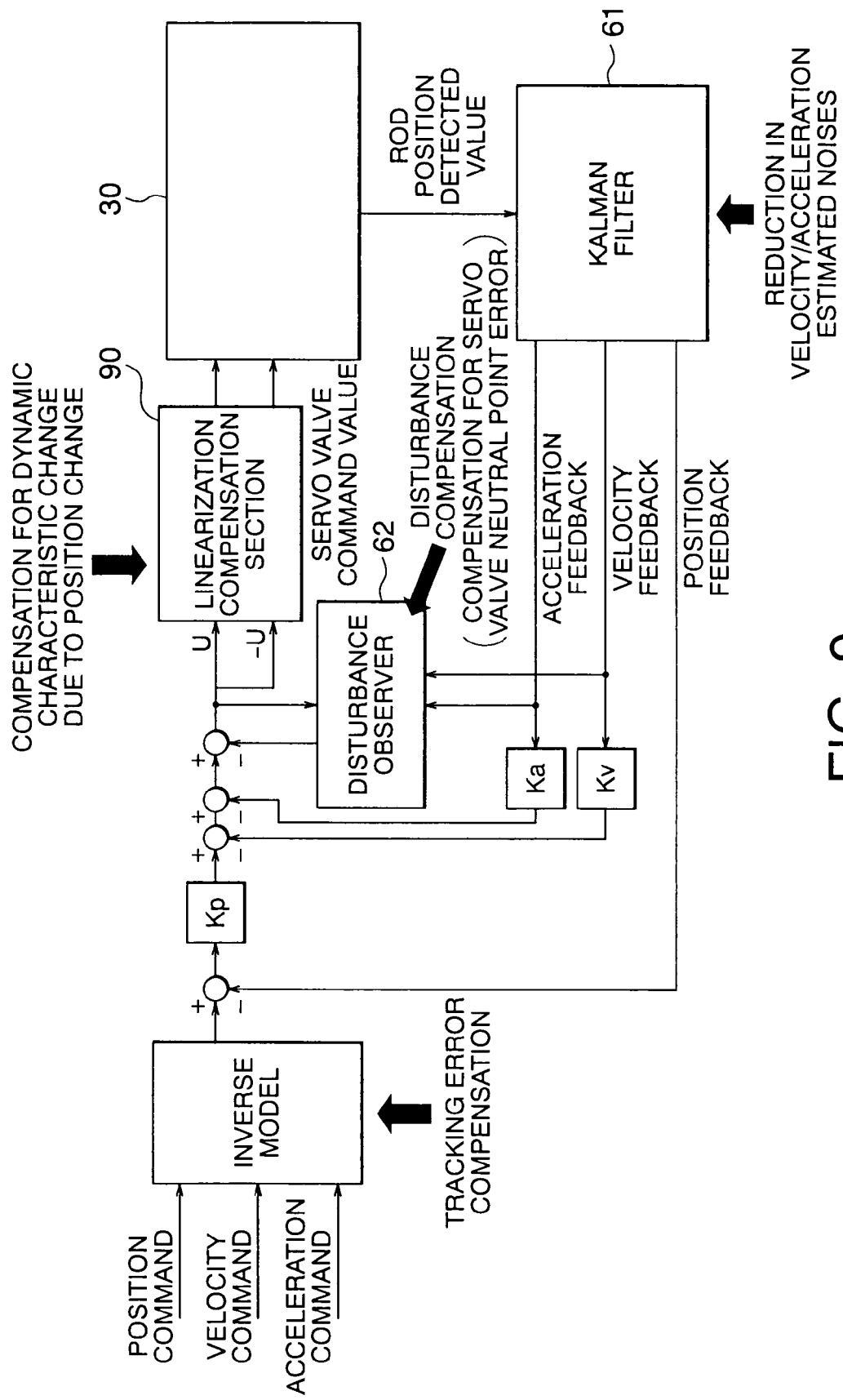
FIG. 9 is a functional block diagram of the position control system in the control computing unit in the precision positioning device according to the present invention.

FIG. 9 is a functional block diagram of the above-described position control system in the control computing unit 60. Here, in order to improve the stop position accuracy of the piston member 20, the position control system further includes a linearization compensating section 90 as a component thereof. The reason for this is as follows. Since the piston member 20 moves along the up-and-down direction, it is necessary to compensate for a pressure change in each of the pressure chambers 10A and 10B due to a position change of the piston head 23. The pressure change is a model having strong non-lineaityr. However, it is possible to linearize this non-linearity model in a minute range. Hence, the linearization compensating section 90 compensates for the pressure change by using the linearized model in a minute range. The linearization compensating section 90 provides the compensated value, as a servo valve command value, to a VP switching section 95 described later (see FIG. 11).

In the actual position control, an S-shaped waveform is used as a standard of an inputted waveform. A starting position x1 (m), an ending position x2 (m), a stop time ts (sec), and a moving velocity v (m/sec) are set as setting items, and the control is executed by using the following position calculation expressions.

When v>0, $$x = x1 + (v/2)\{t - (T_t/2\pi)\sin(2\pi t/T_t)\}$$

When v<0, $$x = x2 - (v/2)\{t - (T_t/2\pi)\sin(2\pi t/T_t)\}$$

Here, $T_t = (2/v)(x2 - x1)$

Figure 10:
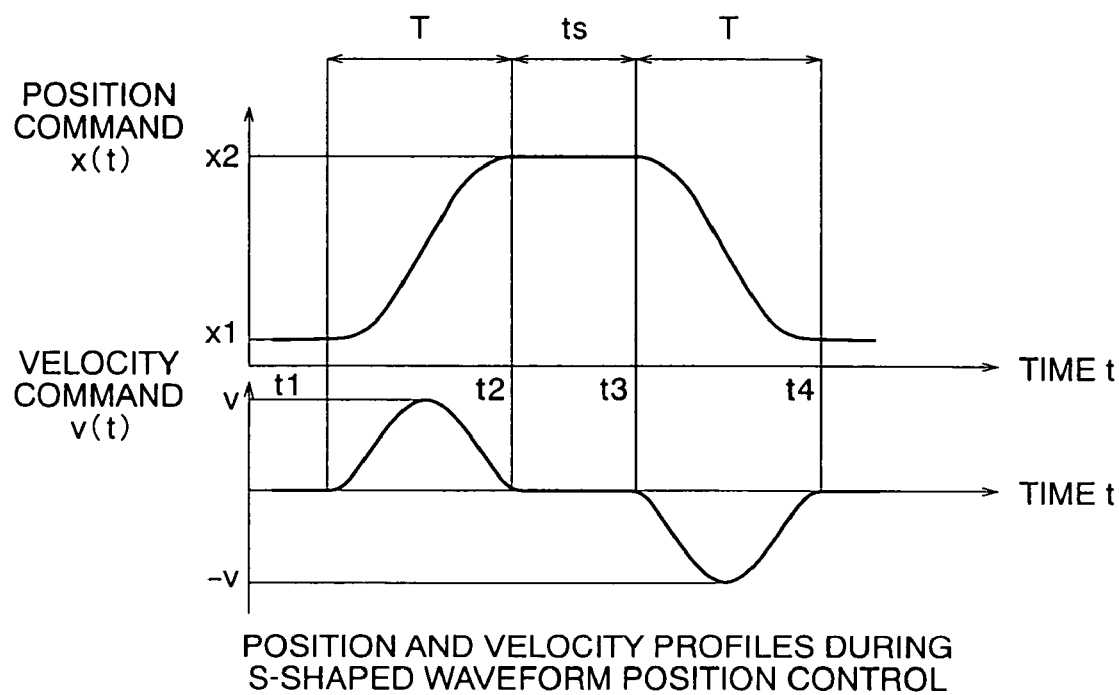
FIG. 10 is a diagram showing examples of position and velocity profiles during position control by the precision positioning device according to the present invention.

FIG. 10 shows the position and velocity profiles at this time.

In the control computing unit 60 according to the present invention, force control is performed by a force control system, in addition to the above-described position control by the position control system. Specifically, the control computing unit 60 performs position control by the position control system until the piston member 20 arrives at a target position, and when arriving at the target position, the position control is switched to force control by the force control system to control the piston member 20 based on a load command value. This is referred to as a "VP switching", which will be described below.

Figure 11:
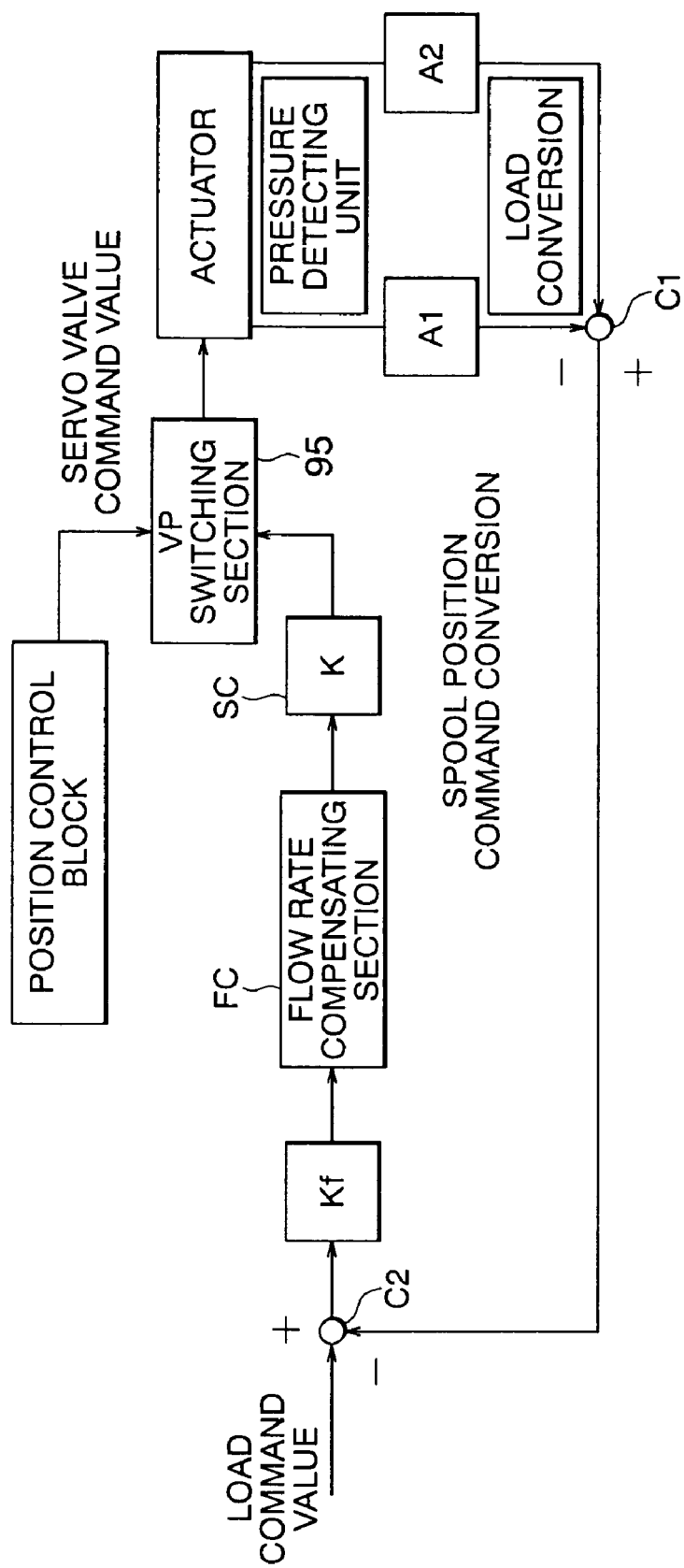
FIG. 11 is a functional block diagram of the force control system in the control computing unit in the precision positioning device according to the present invention.

FIG. 11 is a functional block diagram of the force control system in the control computing unit 60. The position control block shown in FIG. 11 may be regarded as the position control system illustrated in FIG. 9. There is provided the VP switching section 95 to switch between the position control system and the force control system.

Referring to FIG. 11, in the force control system, a first computing section C1 calculates, as a piston load, the output difference between a first converting section A1 that multiplies the pressure detected on the pressure chamber 10A side in the actuator by the pressure receiving area of the piston head 23 to convert into a load (force), and a second converting section A2 that multiplies the pressure detected on the pressure chamber 10B side by the pressure receiving area of the piston head 23 to convert into a load (force). A second computing section C2 calculates the difference between the calculated piston load and a load command value, as a thrust command value. The calculated thrust command value is subjected to flow rate compensation at a flow rate compensating section FC, and after having been converted into a spool position command value by a spool position command converting section SC, it is provided to the VP switching section 95.

In FIG. 11, Kf denotes a load loop gain. The load loop gain calculates an exhaust flow rate of the servo valve 30 from an intake flow rate thereof using a flow rate compensation coefficient. In order to secure a necessary exhaust flow rate, a moving distance of the spool of the servo valve 30 is calculated using a spool position command conversion coefficient K, and the calculated moving distance value is used as a spool position command value of the servo valve 30.

When arriving at a target position, the VP switching section 95 compares a servo valve command value from the position control block, i.e., from the position control system, with the spool position command value of the servo valve 30 calculated by the above-described force control system, and appropriately performs switching from the position control system to the force control system in accordance with a magnitude of the comparison result.

As representative methods by which the position control and the force control (load control) can be continuously performed, two types of operating methods are shown below.

(A) (S-shaped+ramp) two-step switching

The piston member 20 is moved based on a signal with an S-shaped waveform up to a position immediately in front of a target position and stopped there, and after the S-shaped waveform has been switched to a ramp waveform, the piston member 20 is slowly brought near an object. In this case, in order to cause the piston member 20 to perform a designated operation, a target thrust (N), a pressing time (sec), a waiting time (sec), and a switching position (mm) are set in advance, as setting items.

(B) (S-shaped+ramp) velocity continuous switching

The piston member 20 is moved based on a signal with an S-shaped waveform up to a position near a target position. At the point in time when the velocity becomes a designated velocity, the S-shaped waveform is switched to a ramp waveform, and the piston member 20 is slowly brought near an object. In a similar manner as the condition (A), in this case also, a target thrust (N), a pressing time (sec), a waiting time (sec), a switching position (mm), and a switching velocity (mm/sec) are set, as setting items.

Figure 12A:
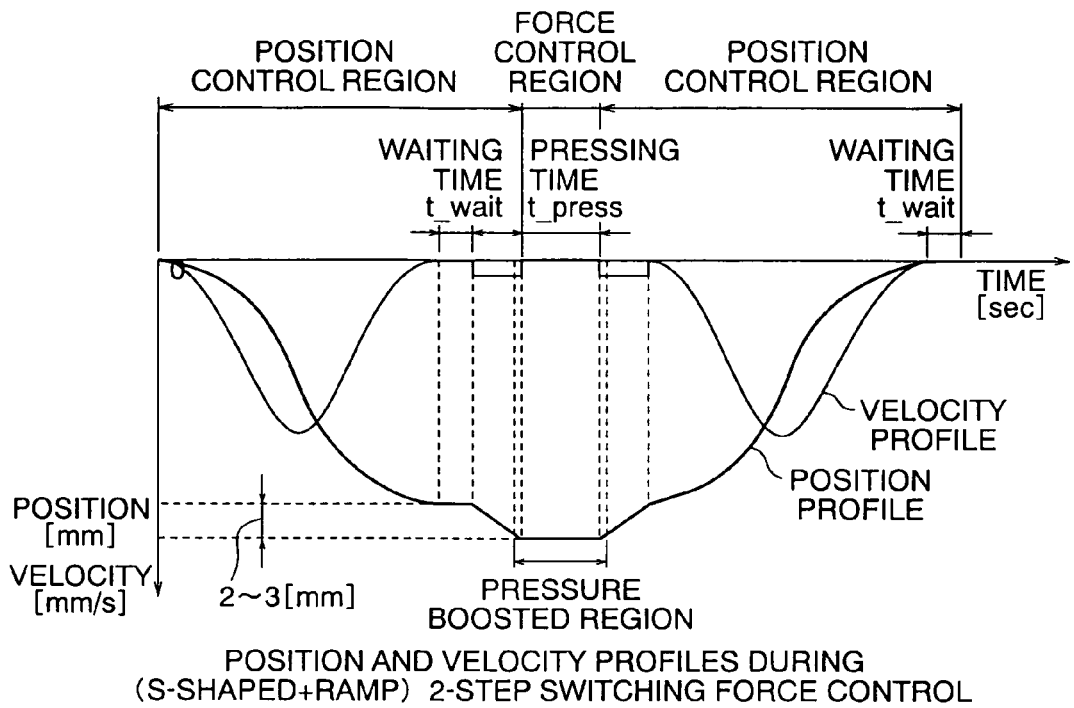
FIGS. 12A and 12B are diagrams showing examples of position and velocity profiles during position control and force control by the precision positioning device according to the present invention.
Figure 12B:
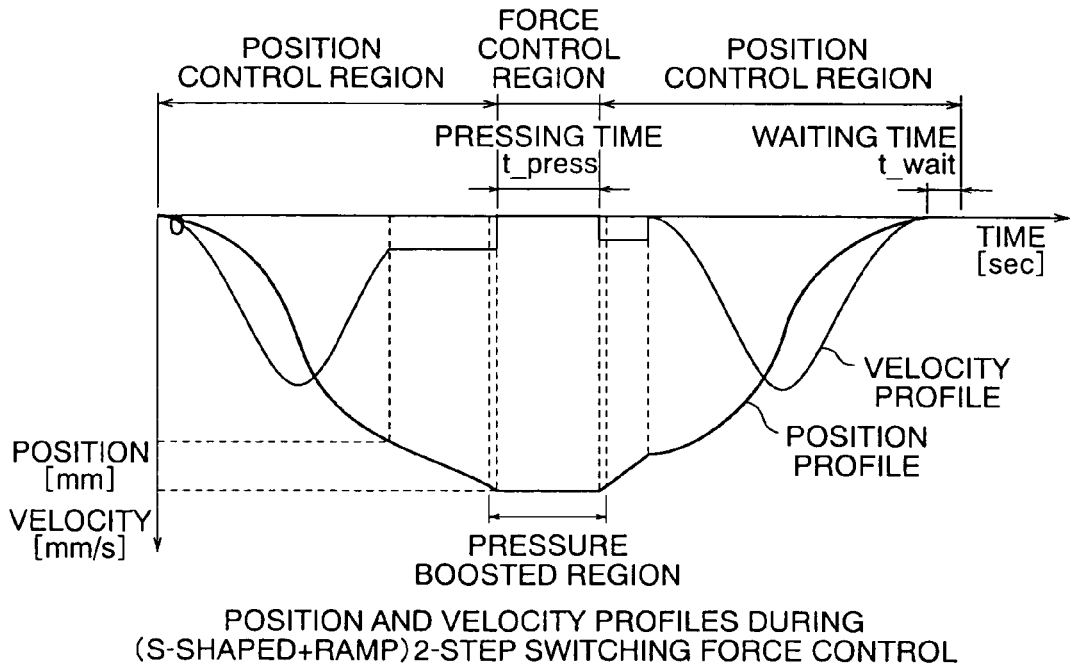

FIGS. 12A and 12B each shows position and velocity profiles based on the above-described position control and force control (load control).

According to the above-described precision positioning device, it is made possible to control a positioning control function and a force (load) control function by the same device through the use of a pneumatic cylinder having a piston member supported in a non-contact state by hydrostatic bearings, a servo valve, and a control computing unit for controlling them. This allows the positioning control accuracy and the load control accuracy to be improved by a simple mechanism.

Specifically, the performance of the present precision positioning device as a drive source in the Z-axis direction is improved in respect of the following items.

An object to be moved (work such as an IC component) can be moved at a high velocity by the same device.

The object to be moved can be stopped at a specified position with high accuracy.

The object to be moved can be grounded by a predetermined force (load) with high accuracy.

The object to be moved can be pressed by a predetermined force (load) with high accuracy.

FIGS. 13A to 13D show measured results of force step responses and those of thrust mean values and error widths during force (load) control. Measurements of force step responses were performed under the above-described conditions (A) and (B), and thrust command values and error widths were obtained under each of these conditions. From these measured results, it can be seen that the variation in the force (load) is in the range of ± several percent to ± 2 percent.

Figures 14A, 14B:
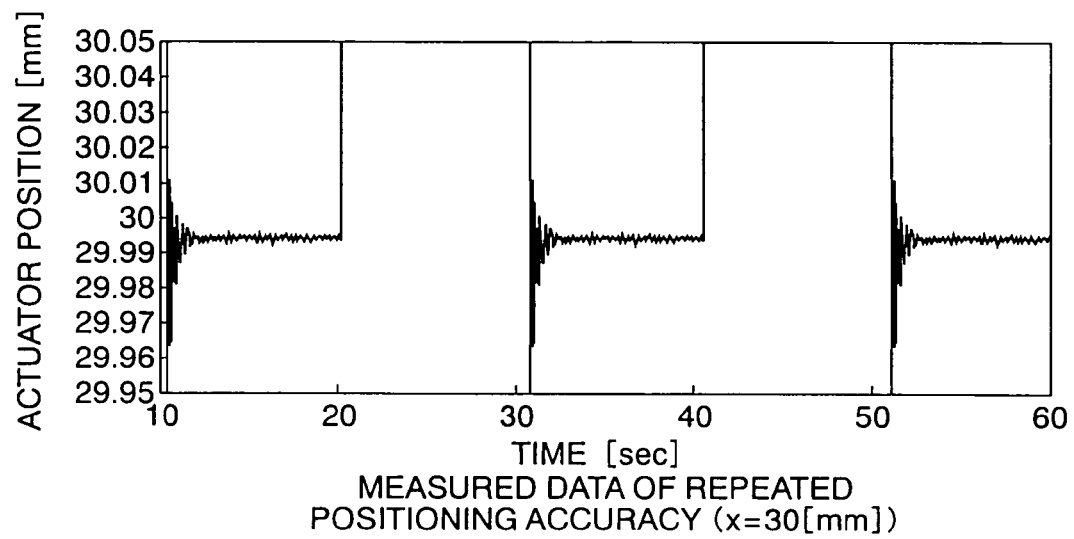
FIGS. 14A and 14B are representations of measured results of the repeated positioning accuracy in the precision positioning device according to the present invention.

On the other hand, FIGS. 14A and 14B show measured results of the repeated positioning accuracy. According to these measured results, it is recognized that the repeated positioning accuracy is in the range of ± a little over ten (μm) to ±5 (μm), and that, when expressed in terms of ± values, the repeated positioning accuracy is in the range of 0.34 to 0.36 (μm).

Meanwhile, in the above-described embodiment, although hydrostatic bearings are used as the bearings, other bearings may be used. For example, metal sealed bearings with low friction are suitable for the bearings, as well.

Next, an embodiment of a processing machine incorporating the precision positioning device according to the present invention will be described. The processing machines each incorporating the precision positioning device according to the present invention covers a fairly broad spectrum including overall processing machinery each having a Z-axis drive mechanism (up-and-down drive shaft), such as manufacturing devices of semiconductors in back end processes (a bonding device, dicer, and handler), a component mounting device (a chip mounter), machine tools (a machining center, electrical discharge machine, and grinding machine), a printing machine, etc. Using the precision positioning device according to the present invention in each of the above-described processing machines as a Z-axis drive mechanism allows the simplification of the processing machine and the improvement in the control performance thereof.

Specifically, the performance as a processing machine is improved in respect of the following items.

The Z-axis drive mechanism is simplified, and the machine can be reduced in size. This reduces the vibrations and inertia of the Z-axis drive mechanism, and facilitates controlling X-Y drive mechanisms combined with the Z-axis drive mechanism.

The number of components can be reduced.

High velocity and high accuracy positioning becomes feasible.

High accuracy pressing becomes implementable, thereby facilitating producing a target thrust.

Deterioration and heating caused by the sliding in a sliding section can be avoided.

Flying of lubricants or the like can be evaded.

Machine maintenance is simplified. For example, the Z-axis drive mechanism can be replaced in its entirety.

Figure 1:
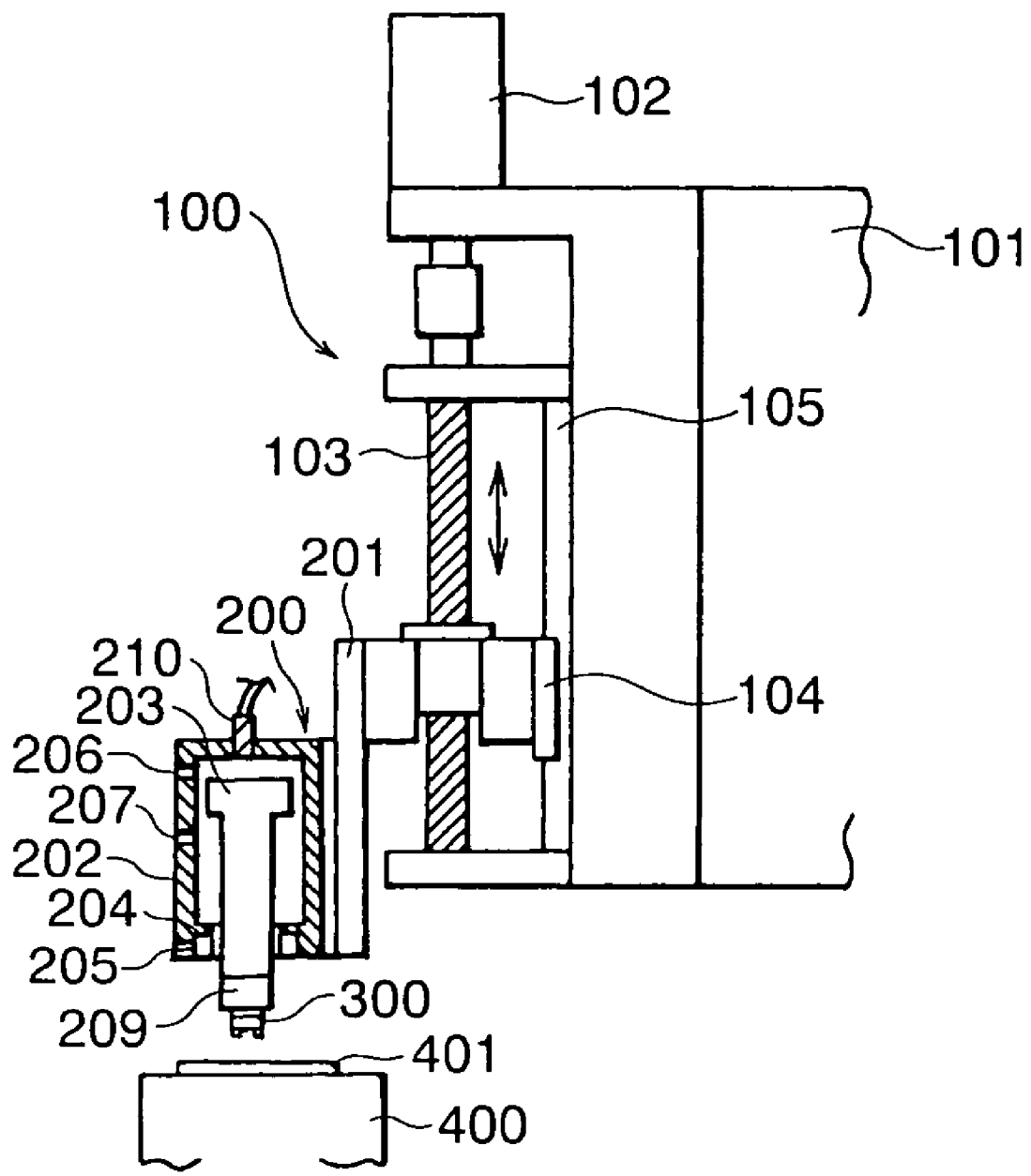
FIG. 1 is a side view of an example of a chip mounter according to a related art.
Figure 15:
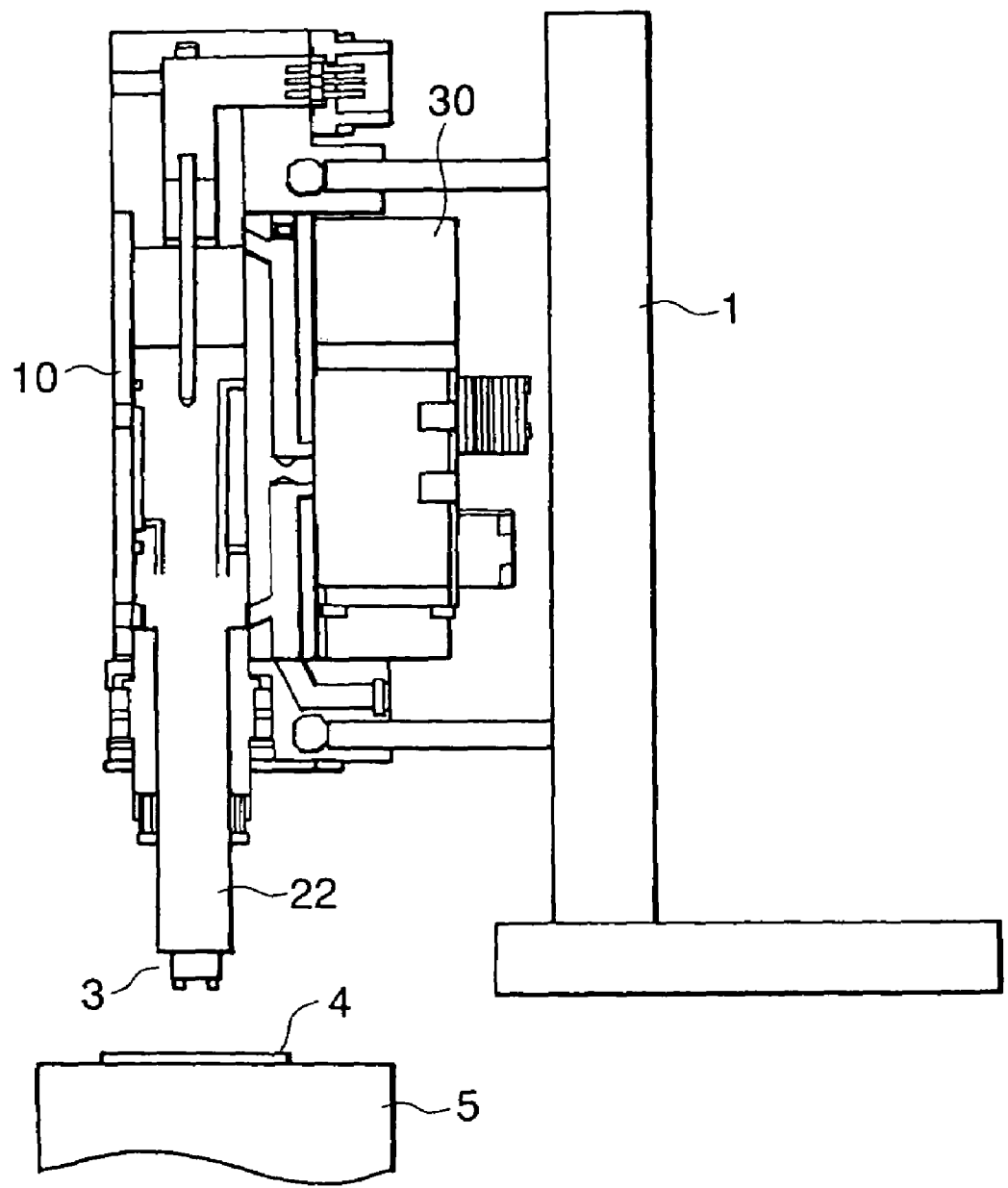
FIG. 15 is a side view of a chip mounter incorporating the precision positioning device according to the present invention.

FIG. 15 shows an embodiment of a chip mounter, as illustrated in FIG. 1, that incorporates the precision positioning device according to the present invention. Referring to FIG. 15, the precision positioning device illustrated in FIG. 3 is assembled in a fixed base frame 1 along the vertical direction so as to work as a Z-axis drive mechanism. As described above, the precision positioning device includes the pneumatic cylinder 10, the piston member slidably accommodated in the pneumatic cylinder 10 in a non-contact state via a plurality of bearings, and having the rod 22 extending along the downward direction; the servo valve 30; and the pneumatic circuit. The rod 22 has a grasping mechanism formed at the lower end thereof for grasping a chip 3 as a work. A substrate 4 on which the chip 3 is to be mounted is placed on a substrate holding stage 5 having an X-axis drive mechanism and a Y-axis drive mechanism.

According to the present invention, a positioning control function and a force (load) control function is realized through the use of a pneumatic cylinder having a piston member supported in a non-contact state by hydrostatic bearings, a servo valve, and a control computing unit for controlling them, whereby a precision positioning device capable of improving the positioning control accuracy and the force (load) control accuracy by simple mechanisms, and a processing machine using the same can be provided.

What is claimed is:

1. A precision positioning device comprising:
a pneumatic cylinder fixed so as to extend along the vertical direction;
a piston member slidably accommodated in the pneumatic cylinder in a non-contact state via bearings, and including a piston head and a rod extending from the piston head along the central axis direction, the inside of the pneumatic cylinder being divided into two pressure chambers by the piston head;
a pneumatic circuit for supplying a gas at a constant pressure to one of the two pressure chambers and supplying the gas at a controlled flow rate to the other of the pressure chambers via a servo valve;
first and second pressure sensors for detecting pressures of the one and the other of the pressure chambers, respectively;
a position sensor for detecting the position of the piston member; and
a control system,
wherein the control system performs position control with respect to the piston member by controlling the servo valve based on a position detection signal from the position sensor, a position command value, a velocity command value, and an acceleration command value;
wherein the control system performs force control with respect to the piston member by controlling the servo valve using pressure detection signals from each of the first and second pressure sensors and a load command value;

wherein the bearings are each a first hydrostatic bearing, wherein the piston member has an aperture formed in the central axis portion thereof and extending along the central axis direction thereof, and wherein the position sensor is formed in the piston member through the use of a fixed shaft that has been inserted into the aperture from above the pneumatic cylinder.

2. The precision positioning device according to claim 1, wherein the control system further comprises:

a position control system that performs the position control until the piston member arrives at a target position;

a force control system that performs the force control with respect to the piston member by a force based on the load command value, when the piston member arrives at the target position; and a switching section that performs switching between the position control system and the force control system.

3. The precision positioning device according to claim 2, wherein the position control system further comprises:

a disturbance observer for correcting a neutral point error in the servo valve; and a Kalman filter for estimating a position, a velocity, and an acceleration of the piston member.

4. The precision positioning device according to claim 3, wherein the position control system further comprises:

a linearization compensating section that compensates for a pressure change of each of the two pressure chambers due to a position change of the piston member, and that provides the compensated value to the switching section as a servo valve command value.

5. The precision positioning device according to claim 2, wherein the force control system further comprises:

a first converting section for multiplying a pressure value detected by the first pressure sensor by the pressure receiving area of the piston head to calculate a first load value;

a second converting section for multiplying a pressure value detected by the second pressure sensor by the pressure receiving area of the piston head to calculate a second load value;

a first computing section for calculating the difference between the first load value and the second load value, as a piston load; and a second computing section for calculating the difference between the calculated piston load and the load command value, as a thrust command value, and providing the calculated thrust command value to the switching section.

6. The precision positioning device according to claim 1, wherein the first hydrostatic bearings are constructed by forming, in the piston head, first passages for introducing thereinto the gas in the one of pressure chambers and blowing the gas onto the inner wall of the pneumatic cylinder.

7. The precision positioning device according to claim 6, wherein the piston member is a double cylindrical body, wherein the piston head has second passages formed therein for introducing the gas that has been blown from the first hydrostatic bearings onto the inner wall of the pneumatic cylinder, into the double cylindrical body, and wherein the end portion of the piston member opposite to the piston head has an exhaust port formed therein for exhausting the gas introduced into the double cylindrical body.

8. The precision positioning device according to claim 1, wherein the rod is slidably supported on the lower end of the pneumatic cylinder in a non-contact state via second hydrostatic bearings, and wherein the second hydrostatic bearings are constructed by forming, in the pneumatic cylinder, a third passage for introducing thereinto the gas in the one of the pressure chambers and blowing the gas onto the outer wall of the rod.

9. A processing machine comprising the precision positioning device as recited in claim 1.

10. A precision positioning device comprising:

a pneumatic cylinder fixed so as to extend along the vertical direction;

a piston member slidably accommodated in the pneumatic cylinder in a non-contact state via bearings, and including a piston head and a rod extending from the piston head along the central axis direction, the inside of the pneumatic cylinder being divided into two pressure chambers by the piston head;

a pneumatic circuit for supplying a gas at a constant pressure to one of the two pressure chambers and supplying the gas at a controlled flow rate to the other of the pressure chambers via a servo valve;

first and second pressure sensors for detecting pressures of the one and the other of the pressure chambers, respectively;

a position sensor for detecting the position of the piston member; and a control system comprising:
a position control system,
a force control system, and
a switching section, wherein the position control system performs position control with respect to the piston member by controlling the servo valve based on a position detection signal from the position sensor, a position command value, a velocity command value, and an acceleration command value;

wherein the force control system performs force control with respect to the piston member by controlling the servo valve using pressure detection signals from each of the first and second pressure sensors and a load command value, wherein the position control system performs the position control until the piston member arrives at a target position; wherein the force control system performs the force control with respect to the piston member by a force based on the load command value, when the piston member arrives at the target position; and wherein the switching section of the control system performs switching between the position control system and the force control system.

11. The precision positioning device according to claim 10, wherein the position control system further comprises:

a disturbance observer for correcting a neutral point error in the servo valve; and a Kalman filter for estimating a position, a velocity, and an acceleration of the piston member.

12. The precision positioning device according to claim 11, wherein the position control system further comprises:

a linearization compensating section that compensates for a pressure change of each of the two pressure chambers due to a position change of the piston member, and that provides the compensated value to the switching section as a servo valve command value.

13. The precision positioning device according to claim 10, wherein the force control system further comprises:
a first converting section for multiplying a pressure value detected by the first pressure sensor by the pressure receiving area of the piston head to calculate a first load value;
a second converting section for multiplying a pressure value detected by the second pressure sensor by the pressure receiving area of the piston head to calculate a second load value;
a first computing section for calculating the difference between the first load value and the second load value, as a piston load; and
a second computing section for calculating the difference between the calculated piston load and the load command value, as a thrust command value, and providing the calculated thrust command value to the switching section.

14. The precision positioning device according to claim 10, wherein the piston member has an aperture formed in the central axis portion thereof and extending along the central axis direction thereof, and wherein the position sensor is formed in the piston member through the use of a fixed shaft that has been inserted into the aperture from above the pneumatic cylinder.

15. The precision positioning device according to claim 10, wherein the bearings are each a first hydrostatic bearing, and wherein the first hydrostatic bearings are constructed by forming, in the piston head, first passages for introducing thereinto the gas in the one of pressure chambers and blowing the gas onto the inner wall of the pneumatic cylinder.

16. The precision positioning device according to claim 15, wherein the piston member is a double cylindrical body, wherein the piston head has second passages formed therein for introducing the gas that has been blown from the first hydrostatic bearings onto the inner wall of the pneumatic cylinder, into the double cylindrical body, and wherein the end portion of the piston member opposite to the piston head has an exhaust port formed therein for exhausting the gas introduced into the double cylindrical body.

17. The precision positioning device according to claim 10, wherein the rod is slidably supported on the lower end of the pneumatic cylinder in a non-contact state via second hydrostatic bearings, and wherein the second hydrostatic bearings are constructed by forming, in the pneumatic cylinder, a third passage for introducing thereinto the gas in the one of the pressure chambers and blowing the gas onto the outer wall of the rod.

18. A processing machine comprising the precision positioning device as recited in claim 10.

19. A precision positioning device comprising:
a pneumatic cylinder fixed so as to extend along the vertical direction;
a piston member slidably accommodated in the pneumatic cylinder in a non-contact state via bearings, and including a piston head and a rod extending from the piston head along the central axis direction, the inside of the pneumatic cylinder being divided into two pressure chambers by the piston head;
a pneumatic circuit for supplying a gas at a constant pressure to one of the two pressure chambers and supplying the gas at a controlled flow rate to the other of the pressure chambers via a servo valve;
first and second pressure sensors for detecting pressures of the one and the other of the pressure chambers, respectively;
a position sensor for detecting the position of the piston member; and
a control system,
wherein the control system performs position control with respect to the piston member by controlling the servo valve based on a position detection signal from the position sensor, a position command value, a velocity command value, and an acceleration command value;
wherein the control system performs force control with respect to the piston member by controlling the servo valve using pressure detection signals from each of the first and second pressure sensors and a load command value;
wherein the bearings are each a first hydrostatic bearing; and
wherein the first hydrostatic bearings are constructed by forming, in the piston head, first passages for introducing thereinto the gas in the one of the pressure chambers and blowing the gas onto the inner wall of the pneumatic cylinder.

20. The precision positioning device according to claim 19, wherein the piston member is a double cylindrical body;
wherein the piston head has second passages formed therein for introducing the gas that has been blown from the first hydrostatic bearings onto the inner wall of the pneumatic cylinder, into the double cylindrical body, and
wherein the end portion of the piston member opposite to the piston head has an exhaust port formed therein for exhausting the gas introduced into the double cylindrical body.

21. The precision positioning device according to claim 19, wherein the control system further comprises:
a position control system that performs the position control until the piston member arrives at a target position;
a force control system that performs the force control with respect to the piston member by a force based on the load command value, when the piston member arrives at the target position; and
a switching section that performs switching between the position control system and the force control system.

22. The precision positioning device according to claim 21, wherein the position control system further comprises:
a disturbance observer for correcting a neutral point error in the servo valve; and
a Kalman filter for estimating a position, a velocity, and an acceleration of the piston member.

23. The precision positioning device according to claim 22, wherein the position control system further comprises:
a linearization compensating section that compensates for a pressure change of each of the two pressure chambers due to a position change of the piston member, and that provides the compensated value to the switching section as a servo valve command value.

24. The precision positioning device according to claim 21, wherein the force control system further comprises:
a first converting section for multiplying a pressure value detected by the first pressure sensor by the pressure receiving area of the piston head to calculate a first load value;
a second converting section for multiplying a pressure value detected by the second pressure sensor by the pressure receiving area of the piston head to calculate a second load value;

a first computing section for calculating the difference between the first load value and the second load value, as a piston load; and a second computing section for calculating the difference between the calculated piston load and the load command value, as a thrust command value, and providing the calculated thrust command value to the switching section.

25. The precision positioning device according to claim 19, wherein the piston member has an aperture formed in the central axis portion thereof and extending along the central axis direction thereof, and wherein the position sensor is formed in the piston member through the use of a fixed shaft that has been inserted into the aperture from above the pneumatic cylinder.

26. The precision positioning device according to claim 19, wherein the rod is slidably supported on the lower end of the pneumatic cylinder in a non-contact state via second hydrostatic bearings, and wherein the second hydrostatic bearings are constructed by forming, in the pneumatic cylinder, a third passage for introducing thereinto the gas in the one of the pressure chambers and blowing the gas onto the outer wall of the rod.

27. A processing machine comprising the precision positioning device as recited in claim 19.

* * * * *